United States Patent [19]
Myer

[11] Patent Number: 5,847,603
[45] Date of Patent: Dec. 8, 1998

[54] AUTOMATIC CONTROL SYSTEM FOR REDUCING DISTORTION PRODUCED BY ELECTRICAL CIRCUITS

[75] Inventor: Robert Evan Myer, Denville, N.J.

[73] Assignee: Lucent Technologies Inc., Murray Hill, N.J.

[21] Appl. No.: 903,931

[22] Filed: Jul. 31, 1997

[51] Int. Cl.[6] .................................. H03F 3/66; H03F 1/26
[52] U.S. Cl. ............................................. 330/52; 330/151
[58] Field of Search .............................. 330/52, 151, 149, 330/297, 63

[56] References Cited

U.S. PATENT DOCUMENTS

| | | | |
|---|---|---|---|
| 4,885,551 | 12/1989 | Myer | 330/52 |
| 5,130,663 | 7/1992 | Tattersall, Jr. | 330/52 |

*Primary Examiner*—Robert Pascal
*Assistant Examiner*—Patricia T. Nguyen
*Attorney, Agent, or Firm*—Claude R. Narcisse

[57] ABSTRACT

An automatic control system for reducing distortion produced by electrical circuit where a pilot signal pulse is applied to the electrical circuit for a period of time during which the system determines the adjustments to be made to its circuitry to reduce the distortion.

17 Claims, 3 Drawing Sheets

AUTOMATIC CONTROL SYSTEM FOR REDUCING DISTORTION PRODUCED BY ELECTRICAL CIRCUITS

FIELD OF THE INVENTION

The present invention is directed to a control system for reducing distortion produced by electrical circuits and in particular to a control system that uses a pulsed pilot feedforward technique for reducing distortion.

DESCRIPTION OF THE RELATED ART

Electrical circuitry in general often adds undesired distortion to an input signal, creating an output signal comprising distortion components and the input signal component. There is therefore a need to devise techniques that can eliminate substantially or reduce significantly the distortion produced by electrical circuitry. A well known technique and method disclosed in U.S. Pat. No. 4,580,105 issued to R. E. Myer on Apr. 1, 1986 is represented by the system shown in FIG. 1 and incorporated herein by reference.

FIG. 1 depicts an automatic control system for reducing the distortion caused by an electrical circuit such as power amplifier 12. An input signal is applied to splitter 34 via path 10. Splitter 34 replicates the input signal on paths 11 and 33. The input signal on path 33 is applied to gain control circuit 32, phase control circuit 30 and delay circuit 28 whose output is fed to cancellation circuit 26. The input signal on path 11 is fed to power amplifier 12 whose output consists of the input signal component and various distortion components. The output of power amplifier 12 is applied to directional coupler 14 which routes a portion of the output of amplifier 12 to cancellation circuit 26.

Cancellation circuit 26 separates a distortion component from the output of power amplifier 12. That is, cancellation circuit 26 separates the distortion component by combining the input signal from the splitter via path 33, modified by gain control circuit 32, phase control circuit 30 and delay circuit 28, with a portion of the output of amplifier 12 from directional coupler 14 to eliminate substantially all of the input signal component from the output of power 12. The phase and amplitude of the distortion component are modified by gain control circuit 24, phase control circuit 22 and amplifier circuit 20. The output of amplifier 20 is a distortion cancellation component which is combined with the output of power amplifier 12 at directional coupler 18 so as to reduce the distortion produced by power amplifier 12.

One of the disadvantages of the prior art technique is the interference created when a pilot signal is inserted into power amplifier 12 to obtain information for making adjustments used to generate the distortion cancellation component. A pilot signal is typically a single frequency signal of proper amplitude for power amplifier 12 or for the particular electrical circuit to which it is applied. The pilot signal simulates a distortion component which is applied to gain control circuit 24, phase control circuit 22 and amplifier 20. The gain and phase of the distortion component are adjusted by gain control circuit 24 and phase control circuit 22 so that when it is combined with the output of power amplifier 12 at directional coupler 18, the distortion present is reduced. The pilot signal thus simulates a distortion component which provides the information necessary to make adjustments for reducing distortion.

Power amplifier 12 typically operates within a particular frequency band. It is desirable that the pilot signal inserted into power amplifier 12 have a spectral content that is located substantially in the middle of the frequency band of operation of power amplifier 12. However, placing the pilot signal in the middle of the frequency band of operation causes interference to occur between the input signal and the pilot signal adding more distortion to the input signal. Attempts at placing the pilot signal in the middle of the frequency band of operation with little or no interference from the input signal result in additional and complex circuitry. The prior art uses a search routine to locate a spectral region within the frequency band of operation that is clear of any input signal; the pilot signal is then placed in that region. This technique is not only costly in terms of complex and costly circuitry, but requires an extended length of time to make the necessary measurements for the adjustments increasing the likelihood of interference with the input signal.

Therefore, there exists a need to have an automatic control system for reducing distortion produced by electrical circuits which uses a pilot signal that does not interfere with the input signal to the electrical circuit. There exists a further need to have an automatic control system that is significantly less costly than the methods used in the prior art.

SUMMARY OF THE INVENTION

The present invention provides for an automatic control system for reducing distortion produced by an electrical circuit. The automatic control system to which an input signal is coupled applies a pilot signal to the electrical circuit for a period of time during which the system obtains information on adjustments made to its circuitry substantially without any interference from the input signal. After the period of time has elapsed, the system uses the adjustment information to reduce the distortion produced by the electrical circuit.

The automatic control system comprises a cancellation circuit coupled to the electrical circuit where the cancellation circuit is configured to isolate the distortion produced by the electrical circuit. The automatic control system further comprises switching circuitry coupled to the electrical circuit and the cancellation circuit. The switching circuitry, through which an input signal is coupled to the electrical circuit and the cancellation circuit, is configured to generate a pilot signal applied to the electrical circuit for a period of time during which the cancellation circuit obtains information on adjustments made to its circuitry substantially without any interference from the input signal. After the period of time has elapsed, the cancellation circuit generates a distortion cancellation component in accordance with the adjustment information so as to reduce the distortion produced by the electrical circuit.

DETAILED DESCRIPTION

Figure 1:
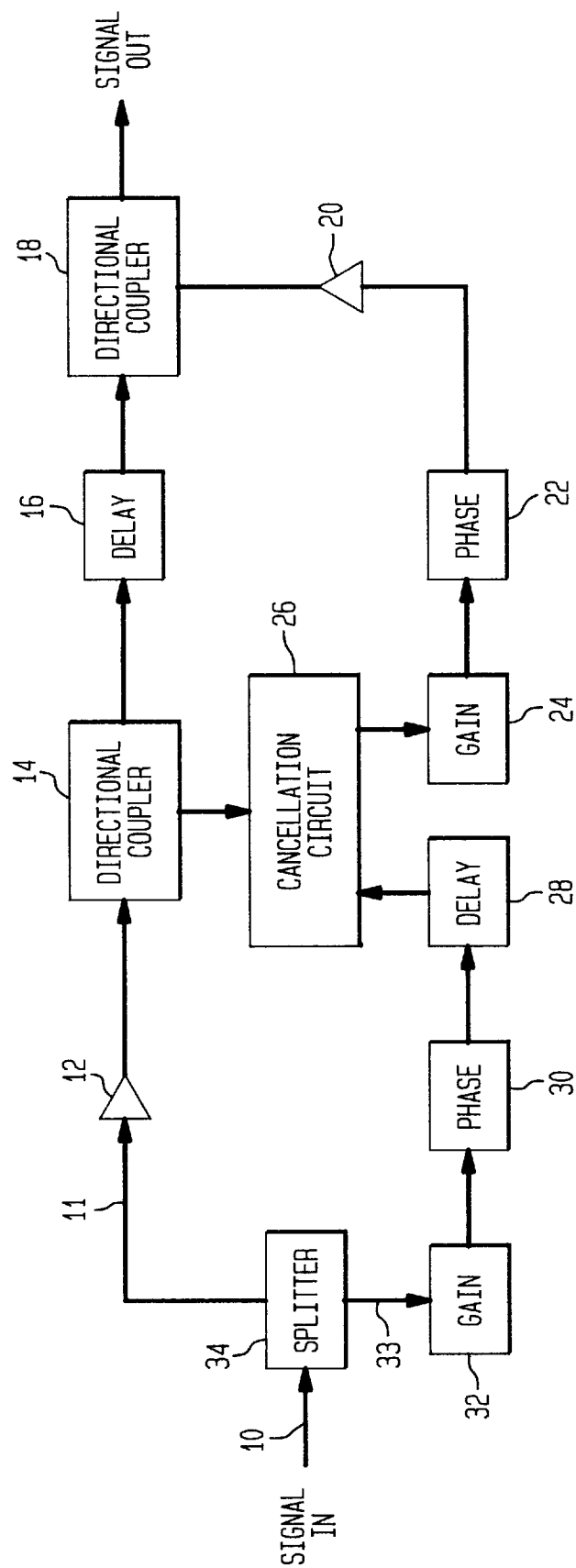
FIG. 1 is a block diagram of the prior art automatic control system.
Figure 2:
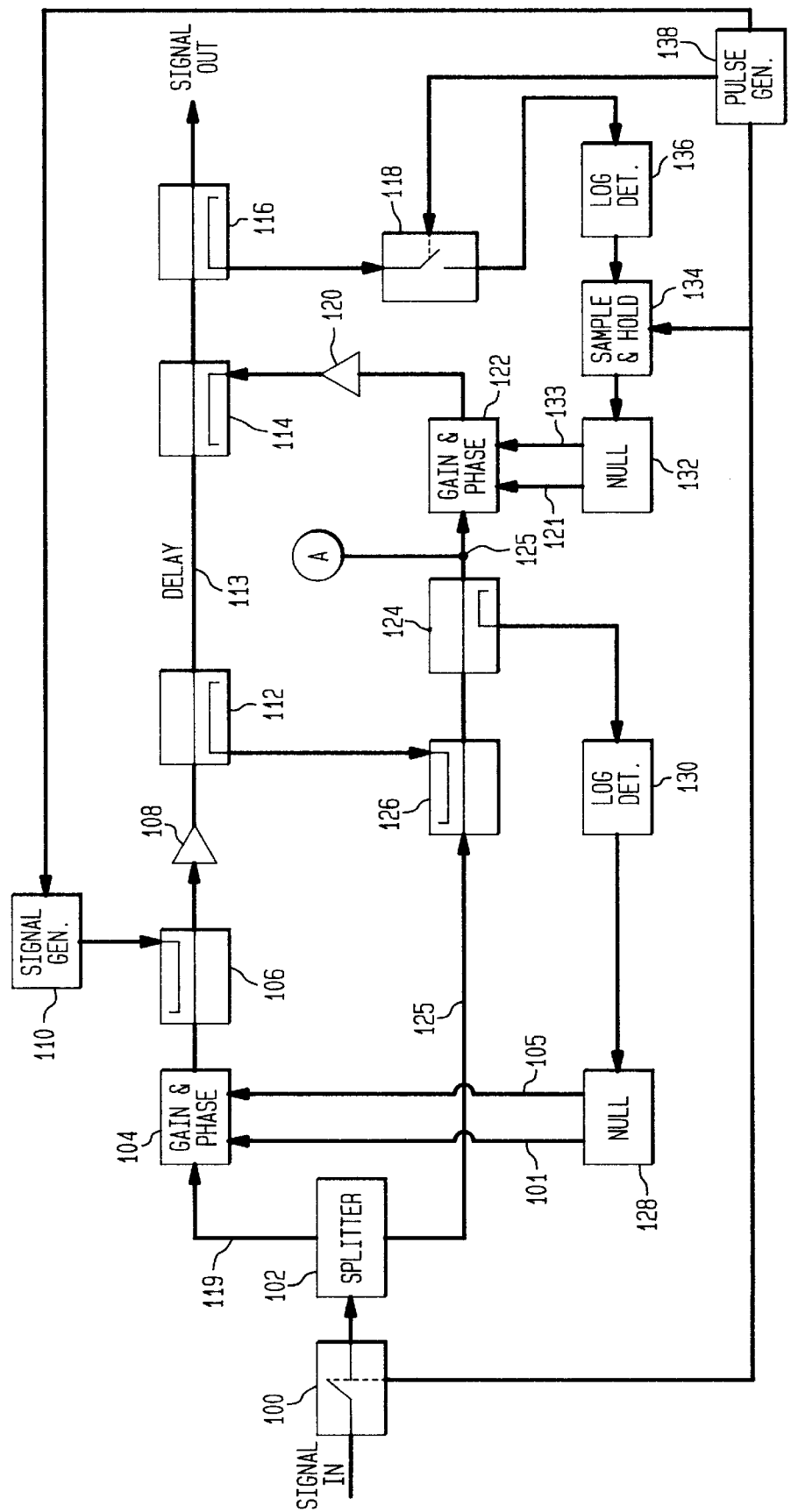
FIG. 2 is a block diagram of the present invention.

FIG. 2 depicts the present invention in which the distortion produced by electrical circuit 108 is reduced by the automatic control system comprising a cancellation circuit and switching circuitry. A pilot signal is applied to electrical circuit 108 for a period of time during which the input signal is decoupled from electrical circuit 108 at switch 100 allowing the cancellation circuit to obtain adjustment information on adjustments made to its circuitry substantially without any interference from the input signal. After the period of time has elapsed, switch 100 couples the input signal to electrical circuit 108 and the cancellation circuit generates a distortion cancellation component in accordance with the adjustment information so as to reduce the distortion produced by electrical circuit 108.

An input signal is coupled to the input of electrical circuit 108 via switch 100. The input signal applied at switch 100 is replicated in two signal paths (paths 119 and 125) emanating from splitter 102. A cancellation circuit comprises a first feedback loop that includes coupler 112, coupler 126, coupler 124, Log detector 130, null circuit 128 and gain/phase circuit 104. The first feedback loop thus has a plurality of couplers (112, 126, 124) connected in series whose output is coupled to Log detector 130 whose output is coupled to null circuit 128 which controls gain/phase circuit 104 via control paths 101 and 105. As is explained below, the first feedback loop isolates at its output (point A) the distortion produced by electrical circuit 108.

In path 119, the input signal is applied to gain/phase circuit 104, coupler 106 and electrical circuit 108. In the other path, i.e., path 125, the input signal is delayed. The delayed input signal is applied to coupler 126 then to coupler 124 where a portion of the input signal is fed to Log detector 130 and null circuit 128. The output of Log detector 130 is sensed by null circuit 128 which uses this output to adjust the gain and phase of the input signal via gain/phase circuit 104 such that the output of electrical circuit 108 is substantially the inverse (equal in amplitude but 180° out of phase) of the delayed input signal.

A portion of the output of electrical circuit 108 resulting from the adjustments made by null circuit 128 is obtained at coupler 112 and fed to coupler 126 where it is combined with a replica of the input signal delayed by delay path 125. The delay experienced by the input signal through path 125 is made substantially equal to the delay experienced by the input signal after having been processed by gain/phase circuit 104, coupler 106, electrical circuit 108 and coupler 112. When the output signal is combined with the delayed input signal at coupler 126, the two signals cancel each other leaving only the distortion from the output of electrical circuit 108 at the distortion output (point A). Thus, the first feedback loop serves to isolate the distortion and said distortion is fed to point A (the distortion output) via coupler 124 and path 125 to another part of the cancellation circuit called the second feedback loop.

Still referring to FIG. 2, the second feedback loop includes gain/phase circuit 122, amplifier 120, coupler 114, coupler 116, switch 118, Log detector 136, Sample & Hold circuit 134 and null circuit 132. Switch 118 couples part of the output of electrical circuit 108 to part of the second feedback loop. In particular, the output of electrical circuit 108 is connected to series-connected couplers 112, 114 and 116 coupled to Log detector 136 via switch 118. Log detector 136 is coupled to Sample & Hold circuit 134 which is coupled null circuit 132. Null circuit 132 controls gain/phase circuit 122 via control paths 121 and 133. Part of the second feedback loop forms a feedforward circuit comprising gain/phase circuit 122, amplifier 120 and coupler 114. The feedforward circuit couples the distortion output (point A) to the output of electrical circuit 108. As is explained below, the feedforward circuit is used to generate a distortion cancellation component at the output of amplifier 120 which is combined with the output of electrical circuit 108 at coupler 114 to reduce the distortion produced by electrical circuit 108. The first feedback loop and the second feedback loop each has a time response whereby the time response of the first feedback loop is much slower than the time response of the second feedback loop. That is, the second feedback loop can react to certain signals, such as narrow pulsed signals, while the first feedback loop cannot react to such signals.

In addition to the cancellation circuit, the automatic control system comprises switching circuitry. The switching circuitry comprises switch 100, Signal generator 110, and Pulse generator 138. Pulse generator 138 is coupled to and controls switch 100, Signal generator 110, switch 118 and Sample & Hold circuit 134. Pulse generator 138 is configured to generate a pulse for a period of time during which the input signal is decoupled from electrical circuit 108 at switch 100. Pulse generator 138 is also configured to control Signal generator 110 such that during said period of time a pilot signal is generated by Signal generator 110. The pilot signal is applied to electrical circuit 108 via coupler 106.

Figure 3:
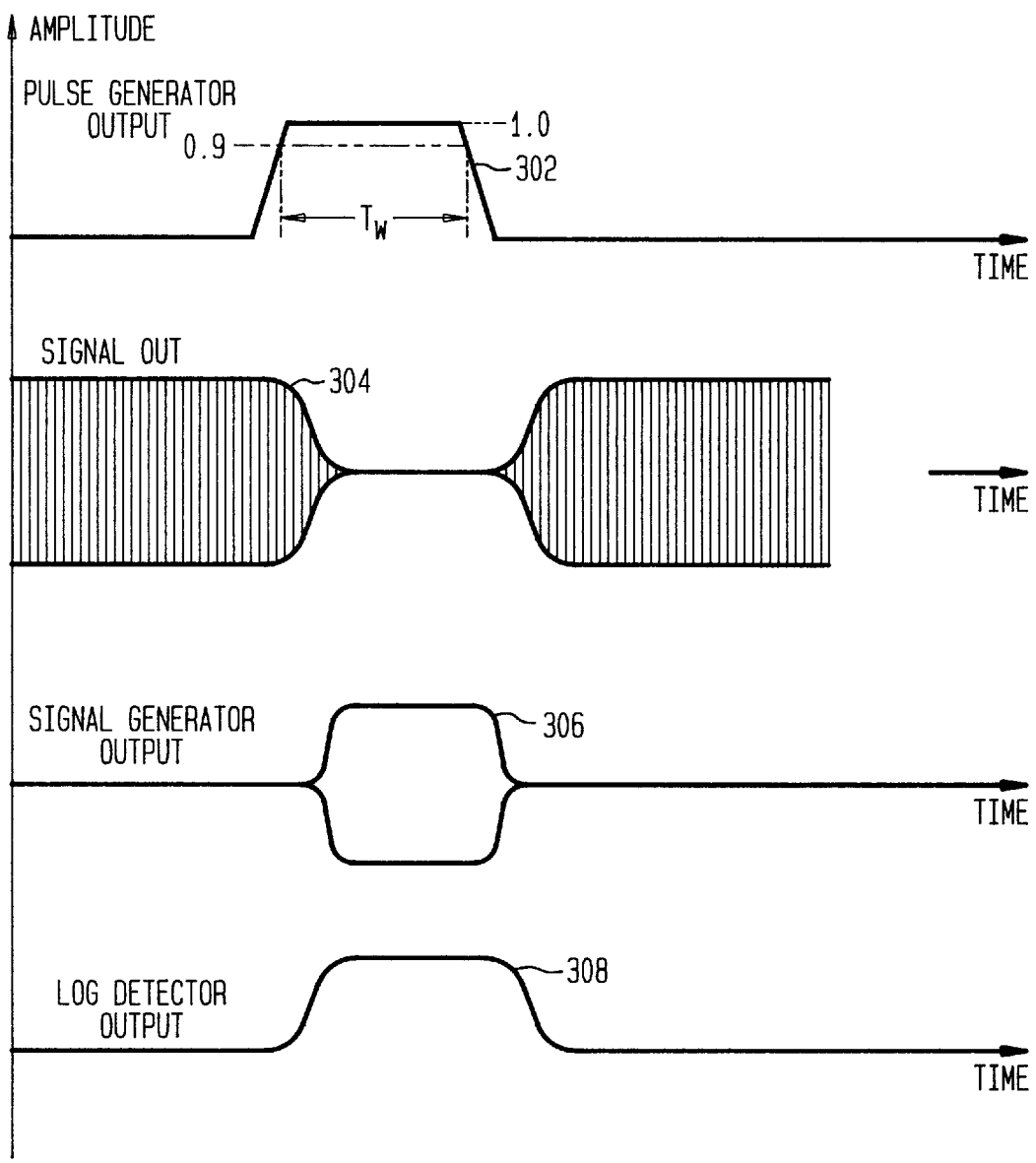
FIG. 3 is a timing diagram of the present invention.

The switching circuitry operates in conjunction with the cancellation circuit which generates a distortion cancellation component in accordance with the adjustment information obtained by the cancellation circuit during the occurrence of the pilot signal. FIG. 3 shows a timing diagram of the operation of the switching circuitry in conjunction with the cancellation circuit. For illustrative purposes only, electrical circuit 108 is assumed to be an RF amplifier to which an RF input signal is applied. It will be understood, however, that electrical circuit 108 can be any electrical circuit to which a pilot signal can be applied for the purpose of reducing distortion produced by electrical circuit 108.

Referring to FIGS. 2 and 3, the output of RF amplifier 108 due to the RF input signal is shown as signal 304. Pulse generator 138 generates pulse 302 of width $T_w$. The pulse width $T_w$ is typically measured at points representing 90% of the amplitude of the pulse. During the occurrence of pulse 302, switch 100, which is activated by pulse 302, decouples the RF input signal from RF amplifier 108 and pilot signal 306 (generated by Signal generator 110) is applied to RF amplifier 108. Also, switch 118 is activated such that coupler 116 is coupled to Log detector 136. During the occurrence of pulse 302, there is no signal in path 125 and no signal other than the pilot signal enters RF amplifier 108. Any portion of the pilot signal entering the first feedback loop is of substantially no consequence because the time response of the first feedback loop is made so that it is much too slow to react to pilot signal 306. That is, the time duration of the pilot signal is much too brief for the first feedback loop to be able to react to such signals.

The time duration of pulse 302 and thus the pilot signal 306 are made short so as not to significantly affect the input signal. In many applications $T_w$ can be less than 100 nanoseconds. RF amplifier 108 (and any other electrical circuit) has a frequency band within which it operates. It is desirable that the spectral content of the pilot signal be located in the middle of the frequency band of operation because the distortion component simulated by such a pilot signal would tend to be substantially similar to the distortion produced by RF amplifier 108 when the RF input signal is coupled through switch 100, i.e., during normal operation of RF amplifier 108. An added advantage of a narrow pilot signal is that the energy generated by such a signal is spread substantially across the band of operation. During the occurrence of pulse 302, signal 304, which is the output signal of RF amplifier 108 due to the input signal, goes to zero. Thus, the pilot signal simulates a distortion component which is modified by the second feedback loop as discussed below.

Still referring to FIGS. 2 and 3, a portion of the distortion component is obtained from coupler 112 and applied at point A to the feedforward circuit. Also, a portion of the distortion component is obtained from coupler 116 and coupled via switch 118 to Log detector 136 whose output is signal 308. Pulse 302 causes Sample & Hold circuit 134 to sample signal 308 during the occurrence of the pilot signal and the sampled value is applied to null circuit 132. Null circuit 132 adjusts the gain and phase of gain/phase circuit 122 such that the sampled value appearing at the output of Sample & Hold circuit 134 is decreased.

In particular, the gain and phase of the distortion component are modified so that the output of amplifier 120 is a signal that is substantially the inverse of the distortion component. The delay experienced by the output of RF amplifier 108 through coupler 112 and delay path 113 is made substantially equal to the delay experienced by RF amplifier 108 output from coupler 112 to coupler 126, coupler 124, gain/phase circuit 122 and amplifier 120 such that when the two signals are combined at coupler 114, they tend to cancel each other. As a result, the output of Log detector 136 decreases and the sampled value at the output of Sample & Hold circuit 134 also decreases. Thus, the adjustments made by null circuit 132 are based on the simulated distortion component (i.e., the pilot signal) and are made substantially without any interference from the input signal since the input signal has been decoupled from RF amplifier 108. Null circuit 132, which is part of the second feedback loop, is able to obtain and store the adjustment information during the occurrence of the pilot signal so that such information is used to reduce distortion after the occurrence of the pilot signal. Part of null circuit 132 are memory devices (e.g., capacitors, memory circuits) that are able to obtain and store the adjustment information for use after the occurrence of the pilot signal.

After pulse 302 has elapsed, the input signal is reapplied to splitter 102 via switch 100 and switch 118 decouples coupler 116 from Log detector 136. The first feedback loop isolates the distortion produced by RF amplifier 108 and applies said distortion at point A to the feedforward circuit which generates a distortion cancellation component. The distortion cancellation component is generated by allowing null circuit 132 to modify the gain and phase of the isolated distortion at point A via gain/phase circuit 122 in accordance with the adjustment information obtained during the occurrence of the pilot signal. As a result, the signal at output of amplifier 120, which is the distortion cancellation component, is substantially the inverse of the output of RF amplifier 108. The distortion cancellation component is combined with the delayed output of RF amplifier 108 at coupler 114 to substantially reduce the distortion produced by RF amplifier 108. This process of applying a pilot signal to electrical circuit 108 to reduce the distortion produced by the circuit can be repeated until the distortion is substantially canceled or reduced to a desired degree.

It will be understood by those of ordinary skill in the art to which this invention belongs that the first feedback loop isolates the distortion by modifying the amplitude and phase of the portion of the output signal obtained from coupler 112. Other well known techniques can be used to isolate the distortion from the output of electrical circuit 108. Similarly, null circuit 132 modifies the amplitude and phase of the distortion to generate a distortion cancellation component that is substantially 180° out of phase (i.e., substantially the inverse) with the distortion. Other well known techniques can be used to generate signals that are substantially the inverse of each other.

The various circuits used in the first and second feedback loops are well known to those of ordinary skill in the art to which this invention belongs. Log detectors 130 and 136 are typically implemented as circuits that calculate the average amplitude of a signal applied to their input. Null circuits 128 and 132 are typically implemented as circuits that can sense an input signal and generate control signals based on the sensed input signal where the control signals can be stored for future use. Gain/phase circuits 104 and 122 are circuits which can modify the amplitude and phase of signals applied to their input based on the values of control signals. Couplers are circuits which can combine two or more input signals and allow access to a portion of the combined signal. Other circuits which perform the above described functions can be used to implement the present invention. Furthermore, the circuits or their equivalents used in the present invention can be implemented with electrical, electronic (digital and analog), optical, electromagnetic and electromechanical devices.

I claim:

1. An automatic control system for reducing distortion comprising an electrical circuit that produces distortion, said automatic control system comprising:

a cancellation circuit coupled to the electrical circuit, the cancellation circuit is configured to isolate the distortion produced by the electrical circuit; and switching circuitry coupled to the electrical circuit and the cancellation circuit, the switching circuitry through which an input signal is coupled to the electrical circuit, is configured to generate a pilot signal applied to the electrical circuit for a period of time during which the cancellation circuit obtains information on adjustments made to its circuitry substantially without any interference from the input signal, and after said period of time has elapsed the cancellation circuit generates a distortion cancellation component in accordance with the adjustment information so as to reduce the distortion produced by the electrical circuit.

2. The automatic control system of claim 1 where the cancellation circuit comprises a first feedback loop configured to isolate the distortion produced by the electrical circuit and a second feedback loop having a feedforward circuit configured to generate the distortion cancellation component by modifying the isolated distortion in accordance with the adjustment information.

3. The automatic control system of claim 2 where the first feedback loop and the second feedback loop each has a time response and where the time response of the first feedback loop is much slower than the time response of the second feedback loop.

4. The automatic control system of claim 1 where the switching circuitry comprises a signal generator coupled to the electrical circuit, a switch through which the input signal is coupled to the electrical circuit and a pulse generator configured to control the signal generator, the switch and the cancellation circuit.

5. The automatic control system of claim 1 where the electrical circuit is an RP amplifier.

6. The automatic control system of claim 1 where the electrical circuit operates within a frequency band having a middle region and the switching circuitry is configured to generate a pilot signal located substantially in the middle region of the frequency band.

7. The automatic control system of claim 1 where the electrical circuit has an output which is combined with the distortion cancellation component to reduce the distortion produced by the electrical circuit.

8. The automatic control system of claim 1 where the switching circuitry is configured to generate a pilot signal for a period of time of less than 100 nanoseconds.

9. An automatic control system for reducing distortion comprising an amplifier that produces distortion and has an input and an output, the automatic control system comprising:

a signal generator coupled to the input of the amplifier;

a first feedback loop having a distortion output where said first feedback loop is configured to isolate the distortion at the distortion output;

a feedforward circuit through which the distortion output is coupled to the output of the amplifier;

a first switch coupled to the input of the amplifier;

a second switch which couples the output of the amplifier to part of a second feedback loop;

a pulse generator coupled to the switches and the signal generator, the first switch being configured to allow an input signal to couple therethrough to the input of the amplifier; and the pulse generator being configured to activate the switches and the signal generator for a period of time during which the first switch decouples the input signal from the input of the amplifier, the signal generator generates a pilot signal which is applied to the amplifier and the output of the amplifier is coupled through the second switch to the second feedback loop which obtains information on adjustments made to its circuitry substantially without any interference from the input signal and after the period of time has elapsed the feedforward circuit generates a distortion cancellation component based on the isolated distortion at the distortion output and in accordance with the adjustment information so as to reduce the distortion produced by the amplifier.

10. The automatic control system of claim 9 where the first feedback loop comprises a plurality of couplers connected in series and having an output connected to a log detector coupled to a null circuit which controls a gain/phase circuit through which the input signal is applied to the amplifier.

11. The automatic control system of claim 9 where the second feedback loop comprises a plurality of couplers connected in series and coupled to a log detector circuit via the second switch, said log detector circuit is coupled to a sample and hold circuit which is coupled to a null circuit where said null circuit controls a gain/phase circuit that is coupled to the output of the amplifier via an amplifier and a coupler.

12. The automatic control system of claim 9 where the feedforward circuit comprises a gain/phase circuit coupled to an amplifier which is coupled to a coupler.

13. A method for controlling the distortion produced by an electrical circuit having an input and an output, the method comprises the steps of:

applying an input signal to the input of the electrical circuit;

decoupling the input signal from the electrical circuit for a period of time;

applying, during the period of time, a pilot signal to the input of the electrical circuit, obtaining, during the period of time, adjustment information substantially without any interference from the input signal;

reapplying the input signal to the input of the electrical circuit after the period of time has elapsed;

isolating the distortion produced by the electrical circuit;

generating a distortion cancellation component in accordance with the adjustment information;

combining the distortion cancellation component with the output of the electrical circuit after the period of time has elapsed to reduce the distortion produced by the electrical circuit.

14. The method according to claim 13 where the step of applying a pilot signal to the electrical circuit further comprises the step of coupling a portion of the output of the electrical circuit to a second feedback loop.

15. The method according to claim 13 where the step of reapplying the input signal to the electrical circuit further comprises the step of decoupling a portion of the output of the electrical circuit from a second feedback loop.

16. The method according to claim 13 where the step of obtaining adjustment information further comprises the step of isolating, during the period of time, a distortion component resulting from the applied pilot signal and modifying the phase and amplitude of such distortion component.

17. The method according to claim 13 where the step of generating a distortion cancellation component includes the step of modifying the isolated distortion in accordance with the adjustment information obtained during the period of time.

* * * * *